US011863127B2

(12) United States Patent
Chang et al.

(10) Patent No.: US 11,863,127 B2
(45) Date of Patent: Jan. 2, 2024

(54) AMPLIFIER DEVICE

(71) Applicant: Realtek Semiconductor Corporation, Hsinchu (TW)

(72) Inventors: Yang Chang, Hsinchu (TW); Kuan-Yu Shih, Hsinchu (TW); Chia-Jun Chang, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 310 days.

(21) Appl. No.: 17/233,764

(22) Filed: Apr. 19, 2021

(65) Prior Publication Data

US 2022/0173701 A1 Jun. 2, 2022

(30) Foreign Application Priority Data

Dec. 2, 2020 (TW) .................................. 109142505

(51) Int. Cl.
H03F 3/04 (2006.01)
H03F 1/22 (2006.01)
H03F 1/02 (2006.01)
H03F 3/193 (2006.01)
H03F 1/56 (2006.01)

(52) U.S. Cl.
CPC ........... H03F 1/0211 (2013.01); H03F 3/193 (2013.01); H03F 1/56 (2013.01); H03F 2200/222 (2013.01); H03F 2200/387 (2013.01); H03F 2200/451 (2013.01); H03F 2200/522 (2013.01)

(58) Field of Classification Search
CPC .......... H03F 1/0211; H03F 3/193; H03F 1/56; H03F 2200/222; H03F 2200/387; H03F 2200/451; H03F 2200/522; H03F 1/0261; H03F 2200/61; H03F 1/223; H03F 3/04; H03F 1/0244; H03F 2200/504; H03F 1/22; H03F 2200/294; H03F 3/191; H03F 1/565

USPC ................. 330/127, 277, 296, 297, 302, 311
See application file for complete search history.

(56) References Cited

U.S. PATENT DOCUMENTS 7,786,807 B1 * 8/2010 Li ........................ H03F 1/0244
330/311
8,111,104 B2 * 2/2012 Ahadian ................. H03F 1/223
330/311
9,231,583 B2 1/2016 Høyerby et al.
9,716,477 B2 * 7/2017 Wagh .................... H03F 1/3247
(Continued)

Primary Examiner — Khanh V Nguyen
(74) Attorney, Agent, or Firm — Locke Lord LLP; Tim Tingkang Xia, Esq.

(57) ABSTRACT

An amplifier device includes a regulator circuit, a first voltage converting circuit, a first control circuit, and an amplifier circuit. The regulator circuit is configured to output a first driving voltage. The first voltage converting circuit is coupled to the regulator circuit, and is configured to output one of the first driving voltage and at least one first voltages related to the first driving voltage, as a first operating voltage. The first control circuit is coupled to the first voltage converting circuit through a first node, and is configured to receive the first operating voltage and generate a first operating signal according to the first operating voltage and a first control signal. The amplifier circuit is coupled to the first control circuit and the regulator circuit, and is configured to receive the first driving voltage, and is controlled by the first operating signal to generate an output voltage.

19 Claims, 2 Drawing Sheets

(56) References Cited

U.S. PATENT DOCUMENTS

| | | | |
|---|---|---|---|
| 9,960,737 B1* | 5/2018 | Kovac | G05F 1/56 |
| 10,389,306 B2 | 8/2019 | Wagh et al. | |
| 10,587,225 B2* | 3/2020 | Klaren | H03F 1/0222 |
| 11,303,252 B2* | 4/2022 | Esmael | H03F 3/189 |

* cited by examiner

AMPLIFIER DEVICE

CROSS-REFERENCE TO RELATED APPLICATION

This application claims priority to Taiwan Patent Application Serial No. 109142505 filed on Dec. 2, 2020, which is incorporated herein by reference in its entirety.

BACKGROUND

Field of Invention

The present disclosure relates to an amplifier device, and more particularly, to a bias-adjustable amplifier device.

Description of Related Art

In the related art, a linearity of an amplifier is influenced by its bias, and a dynamic range of a signal transceiver is further influenced by the linearity of the amplifier. However, the bias of the amplifier can be various due to process variation, a simulation result for the bias of the amplifier cannot predict actual biases of the manufactured amplifier accurately.

SUMMARY

An objective of the present disclosure is to provide an amplifier device including a regulator circuit, a first voltage converting circuit, a first control circuit and an amplifier circuit. The regulator circuit is configured to output a first driving voltage. The first voltage converting circuit is coupled to the regulator circuit, configured to receive the first driving voltage, and output a first operating voltage, wherein the first operating voltage is one of at least one first voltage related to the first driving voltage and the first driving voltage. The first control circuit is coupled to the first voltage converting circuit through a first node, and configured to receive the first operating voltage, and generate a first operating signal according to the first operating voltage and a first control signal. The amplifier circuit is coupled to the first control circuit and the regulator circuit, and configured to receive the first driving voltage, and controlled by the first operating signal to generate an output voltage.

Another aspect of the present disclosure is to provide an amplifier device including an amplifier circuit, a first voltage converting circuit and a first control circuit. The amplifier circuit is coupled to a voltage input terminal, and configured to receive a first driving voltage. The first voltage converting circuit includes at least one first voltage divider unit, a first switch and a second switch. The at least one first voltage divider unit is coupled to between the voltage input terminal and a reference voltage terminal, configured to receive the first driving voltage, and output at least one first voltage according to the first driving voltage. The first switch is coupled to the voltage input terminal, and configured to receive and transmit the first driving voltage to be a first operating voltage. The second switch is coupled to the at least one first voltage divider unit, and configured to receive and transmit the at least one first voltage to be the first operating voltage. The first control circuit is coupled between the amplifier circuit and the first voltage converting circuit, the first control circuit being configured to receive the first operating voltage to generate a first operating signal, wherein the amplifier circuit is configured to generate an output voltage according to the first operating signal.

DETAILED DESCRIPTION

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

It is understood that, although the terms "first," "second," "third," etc. may be used herein to describe various elements, signals and/or entitles, these elements, signals and/or entities should not be limited by these terms. These terms are only used to distinguish elements, signals and/or entities. Therefore, a first element, signal and/or entity in the description of the disclosure can be referred to a second element, signal and/or entity, and they are not intended to limit the scope of the present disclosure. The term "and/or" used in the description of the disclosure includes anyone and all combinations from one or more associated items.

In the following description, the term "coupled" may be used to indicate that two or more elements are in direct physical or electrical contact with each other, or may also mean that two or more elements may not be in direct contact with each other. "Coupled" may still be used to indicate that two or more elements cooperate or interact with each other.

Figure 1:
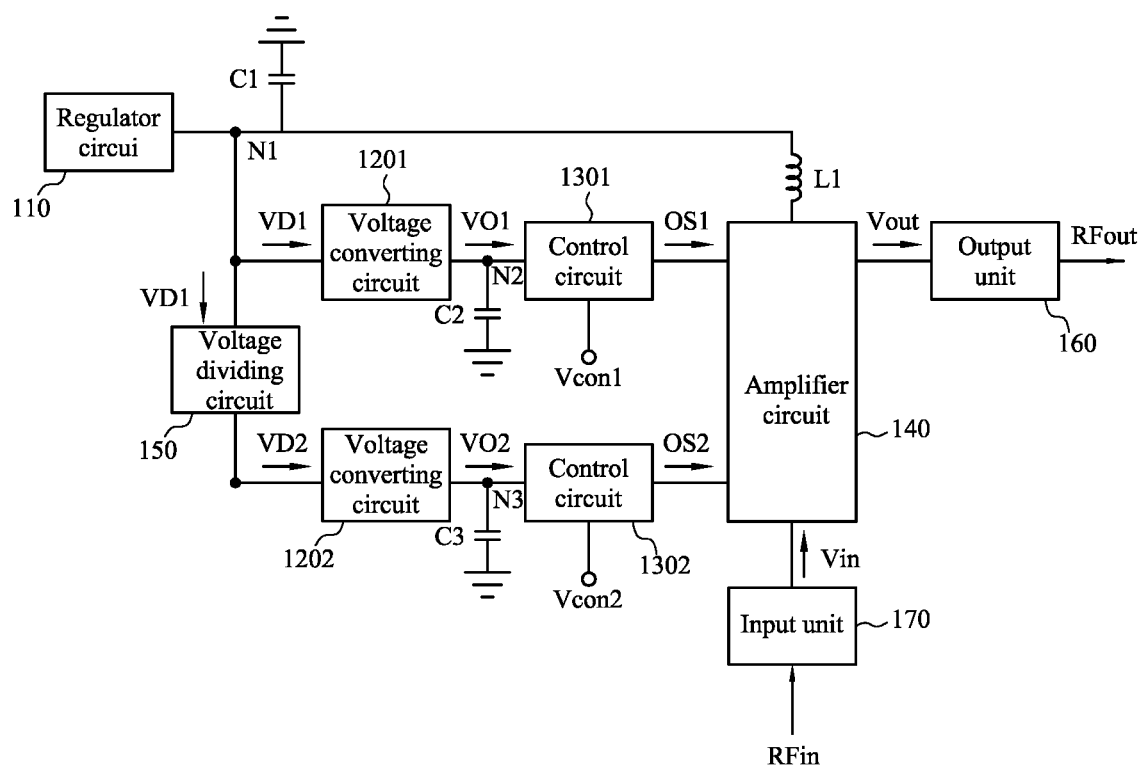
FIG. 1 is a functional block diagram of an amplifier device according to some embodiment of the present disclosure.

Reference is made to FIG. 1; FIG. 1 is a functional block diagram of an amplifier device 100 according to some embodiment of the present disclosure. As shown in FIG. 1, the amplifier device 100 includes a regulator circuit 110, a voltage converting circuit 1201, a voltage converting circuit 1202, a control circuit 1301, a control circuit 1302, an amplifier circuit 140, a voltage dividing circuit 150, an output unit 160 and an input unit 170.

In some embodiments, the regulator circuit 110 is configured to output a driving voltage VD1, the regulator circuit 110 may be any circuit capable of providing the driving voltage VD1, which is not limited in the present disclosure.

In some embodiments, the voltage converting circuit 1201 is coupled between the regulator circuit 110 and the control circuit 1301, and configured to receive and convert the driving voltage VD1 outputted by the regulator circuit 110, to subsequently output an operating voltage VO1 to the control circuit 1301. In some embodiments, the operating voltage VO1 outputted by the voltage converting circuit 1201 is substantially equal to the received the driving voltage VD1 (i.e., the voltage converting circuit 1201 may directly output the driving voltage VD1 without converting the driving voltage VD1). In some embodiments, the voltage converting circuit 1201 may utilize an included voltage divider unit (e.g., a voltage divider unit 2211 shown in FIG. 2) and a switch set (e.g., a switch set 2221 shown in FIG. 2), to convert the driving voltage VD1 into the operating voltage VO1, so as to output the operating voltage VO1 that is different from the driving voltage VD1. Detailed configurations and operations will be described in the following specification.

In some embodiments, a node N1 is between the voltage converting circuit 1201 and the regulator circuit 110, the voltage converting circuit 1201 is coupled to the regulator circuit 110 through the node N1, a capacitor C1 is disposed between the node N1 and a reference voltage terminal (i.e., the capacitor C1 is coupled between the node N1 and the reference voltage terminal). In some embodiments, the reference voltage terminal is a ground. In this specification, the reference voltage terminal being a ground is an example of the present disclosure, which is not limited.

In some embodiments, a node N2 is between the voltage converting circuit 1201 and the control circuit 1301, the voltage converting circuit 1201 is coupled to the control circuit 1301 through the node N2, a capacitor C2 is disposed between the node N2 and the reference voltage terminal (i.e., the capacitor C2 is coupled between the node N2 and the reference voltage terminal).

In some embodiments, the control circuit 1301 is coupled between the voltage converting circuit 1201 and the amplifier circuit 140. The control circuit 1301 is configured to receive an operating voltage VO1 transmitted from the voltage converting circuit 1201, and generate an operating signal OS1 according to the operating voltage VO1 and a control signal Vcon1. Detailed operations regarding the control circuit 1301 will be described in the following specification. In some embodiments, the operating signal OS1 is substantially equal to the operating voltage VO1.

In some embodiments, the amplifier circuit 140 is coupled to the control circuit 1301 and the regulator circuit 110, and configured to receive the operating signal OS1 transmitted from the control circuit 1301 to generate an output voltage Vout. In some embodiments, the amplifier circuit 140 is coupled to the node N1 through an inductive element having a large impedance (e.g., inductor L1).

In some embodiments, the amplifier circuit 140 is configured to receive an input voltage Vin, and amplify the input voltage Vin according to the operating signal OS1 to generate the output voltage Vout corresponding to the operating signal OS1. In other words, adjusting a voltage level of the operating signal OS1 by the voltage converting circuit 1201 and the control circuit 1301, a linearity of the amplifier circuit 140 can be improved.

In some embodiments, the voltage dividing circuit 150 is coupled between the regulator circuit 110 and the voltage converting circuit 1202, and configured to output a driving voltage VD2 according to the driving voltage VD1.

In some embodiments, a node N3 is between the voltage converting circuit 1202 and the control circuit 1302, the voltage converting circuit 1202 is coupled to the control circuit 1302 through the node N3. The voltage converting circuit 1202 is configured to receive and convert the driving voltage VD2 to output an operating voltage VO2 to the control circuit 1302. After the control circuit 1302 has received the operating voltage VO2, the control circuit 1302 is configured to generate an operating signal OS2 according to the operating voltage VO2 and a control signal Vcon2 to the amplifier circuit 140. In this embodiment, the amplifier circuit 140 is configured to amplify the input voltage Vin according to the operating signal OS1 and the operating signal OS2 those are different from each other, to generate the output voltage Vout corresponding to the operating signal OS1 and the operating signal OS2. In some embodiments, a capacitor C3 is disposed between the node N3 and the reference voltage terminal, the capacitor C3 is coupled between the node N3 and the reference voltage terminal. In some embodiments, the control signal Vcon1 and the control signal Vcon2 may be generated by a digital control circuit (not shown in FIG. 1). In some embodiments, operations and connections of the voltage converting circuit 1202 and the control circuit 1302 are similar to those of the voltage converting circuit 1201 and the control circuit 1301, which will not be reiterated herein.

In other embodiments, the voltage converting circuit 1202 may be connected to the regulator circuit 110 without the voltage dividing circuit 150. That is, the voltage converting circuit 1202 may be directly connected to the regulator circuit 110. In other embodiments, the amplifier device 100 may a combination including one or more voltage converting circuits and cooperative control circuits and voltage dividing circuits as above mentioned and the present disclosure can be provided without being limited to a number of circuits as above mentioned and the figures. For example, in the amplifier device 100, at least one of the voltage dividing circuit 150, the voltage converting circuit 1202, the control circuit 1302, the output unit 160 and the input unit 170 can be omitted. For another example, in addition to a first path including the voltage converting circuit 1201 and the control circuit 1301 and a second path including the voltage converting circuit 1202 and the control circuit 1302, the amplifier device 100 may further include an additional path including a voltage converting circuit and a cooperative control circuit, e.g., a third path, a fourth path and the like. The additional path may be coupled between the regulator circuit 110 and the amplifier circuit 140, operations and connection relationships of the additional path are similar to those of the voltage converting circuit 1201 and the control circuit 1301, which will not be reiterated herein.

In some embodiments, the amplifier device 100 further include an output unit 160 configured to receive and generate an output signal RFout according to the output voltage Vout. In some embodiments, the output signal RFout may be transmitted to a mixer (not shown in FIG. 1) or any circuits and elements that can cooperate with the amplifier device 100, which is not limited in the present disclosure.

In some embodiments, the amplifier device 100 further include an input unit 170 configured to receive an input signal RFin to generate the input voltage Vin. In some embodiments, the input signal RFin may be transmitted from an antenna or a soldering pad, which is not limited in the present disclosure.

Figure 2:
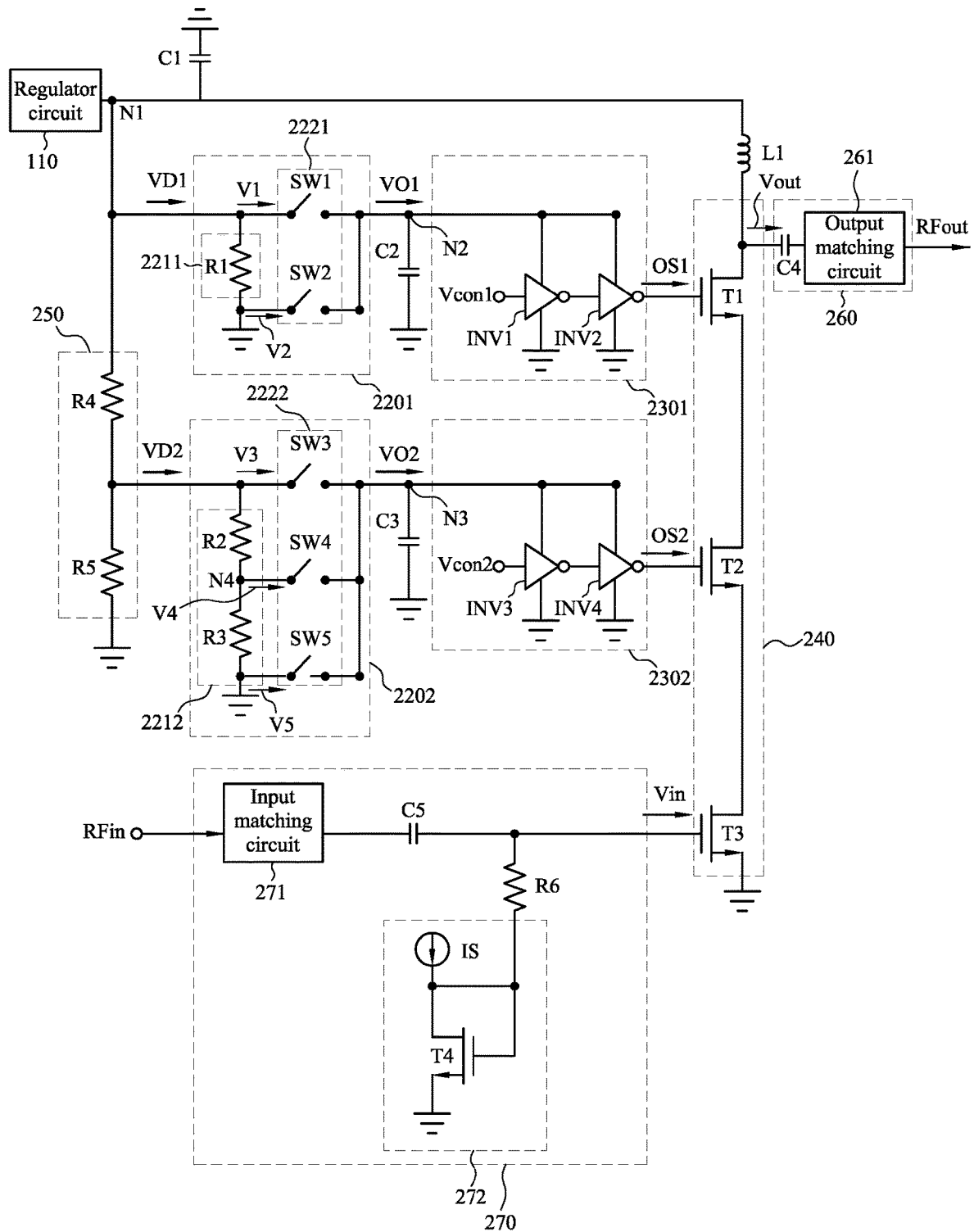
FIG. 2 is a schematic circuit diagram of the amplifier device in FIG. 1 according to some embodiment of the present disclosure.

Reference is made to FIG. 2. FIG. 2 is a schematic circuit diagram of an amplifier device 200 in FIG. 1 according to some embodiment of the present disclosure. The circuit in FIG. 2 shows detailed circuit structures of the amplifier device 100, which is not limited in the present disclosure.

As shown in FIG. 2, the voltage converting circuit 2201 is a feasible implementation of the voltage converting circuit 1201 or the voltage converting circuit 1202 in FIG. 1. The voltage converting circuit 2201 may include a voltage divider unit 2211 and a switch set 2221. As shown in FIG. 2, a terminal of the switch set 2221 is coupled to the regulator circuit 110 through the node N1 and configured to receive a voltage V1, and another terminal of the switch set 2221 is coupled to the regulator circuit 110 through the voltage divider unit 2211 and configured to receive a voltage V2. Therefore, the voltage V1 received by the switch set 2221 is substantially equal to the driving voltage VD1, while the voltage V2 received by the switch set 2221 is different from the voltage V1.

In some embodiments, the voltage divider unit 2211 includes a resistor R1 coupled between the regulator circuit 110 and the reference voltage terminal, and the resistor R1 is configured to receive the driving voltage VD1 and output the voltage V2 to the switch set 2221 according to the driving voltage VD1.

In some embodiments, the switch set 2221 includes a switch SW1 and a switch SW2, and configured to respectively receive the voltage V1 and the voltage V2. When the switch SW1 is turned on, the switch set 2221 outputs the voltage V1 (which is the operating voltage VO1) to a control circuit 2301. When the switch SW2 is turned on, the switch set 2221 outputs the voltage V2 (which is the operating voltage VO1) to the control circuit 2301. In some embodiments, the switch SW1 is parallel to the switch SW2, a plurality of terminals of the switches SW1 and SW2 are coupled to the node N2, and a plurality of other terminals of the switches SW1 and SW2 are respectively coupled to different terminals of the resistor R1. In other words, the switch SW1 is coupled between the regulator circuit 110 (through the node N1) and the node N2, the switch SW2 is serially connected to the voltage divider unit 2211 (e.g., the resistor R1) and coupled between the regulator circuit 110 and the node N2, and the switch SW2 is also coupled between the reference voltage terminal and the node N2.

In some embodiments, a voltage converting circuit 2202 is a feasible implementation of the voltage converting circuit 1201 or the voltage converting circuit 1202 in FIG. 1, the voltage converting circuit 2202 may include a voltage divider unit 2212 and a switch set 2222. In some embodiments, the voltage divider unit 2212 includes a resistor R2 and a resistor R3, a node N4 is between the resistor R2 and the resistor R3, the resistor R2 is coupled to the resistor R3 through the node N4, and the resistors R2 and R3 are serially connected between a voltage dividing circuit 250 and the reference voltage terminal. The voltage divider unit 2212 is configured to receive and output a voltage V4 and a voltage V5 to the switch set 2222 according to the driving voltage VD2. Likewise, the voltage V3 received by the switch set 2222 is substantially equal to the driving voltage VD2, while the voltage V4 and the voltage V5 received by the switch set 2222 are different from the voltage V3.

In some embodiments, the switch set 2222 includes a switch SW3, a switch SW4 and a switch SW5. The switches SW3, SW4 and SW5 are configured to respectively receive the voltages V3, V4 and V5. As shown in FIG. 2, a plurality of terminals of the switches SW3, SW4 and SW5 are coupled to the node N3, and a plurality of other terminals of the switches SW3, SW4 and SW5 are respectively coupled to a plurality of terminals of the resistors R2 or R3. For example, the switch SW3 is coupled between the voltage dividing circuit 250 and the node N3, the switch SW4 is coupled between the node N4 and the node N3, and the switch SW5 is coupled between the reference voltage terminal and the node N3. When the switch SW3 is turned on, the switch set 2222 outputs the voltage V3 (which is the operating voltage VO2) to a control circuit 2302. When the switch SW4 is turned on, the switch set 2222 outputs the voltage V4 (which is the operating voltage VO2) to the control circuit 2302. When the switch SW5 is turned on, the switch set 2222 outputs the voltage V5 (which is the operating voltage VO2) to the control circuit 2302.

In other embodiments, the voltage divider unit 2211 and the voltage divider unit 2212 may respectively include a plurality of serial-connected resistors and/or a plurality of parallel-connected resistors, the present disclosure can be provided without being limited to the embodiment as shown in FIG. 2.

In some embodiments, the control circuit 2301 is a feasible implementation of the control circuit 1301 or the control circuit 1302 in FIG. 1. The control circuit 2301 may include an inverter INV1 and an inverter INV2. In some embodiments, the inverter INV2 is serially connected between the inverter INV1 and an amplifier circuit 240, and the inverters INV1 and INV2 are coupled to the node N2 to receive the operating voltage VO1. In some embodiments, the inverter INV1 is configured to receive the control signal Vcon1, and cooperate with the inverter INV2 to generate the operating signal OS1 according to the control signal Vcon1 and the operating voltage VO1. In some embodiments, when the control signal Vcon1 is at a high level (e.g., logic 1), the operating signal OS1 received by the amplifier circuit 240 is also at the high level, then the amplifier circuit 240 in some embodiments is considered equivalent to be coupled to the node N2. In some embodiments, when the control signal Vcon1 is at a low level (e.g., logic 0), the operating signal OS1 received by the amplifier circuit 240 is also at the low level, then the amplifier circuit 240 in some embodiments is considered equivalent to be coupled to the reference voltage terminal, such that the amplifier circuit 240 is turned off. When the amplifier circuit 240 is turned off, the output voltage Vout received by an output unit 260 is associated with a driving voltage outputted by the regulator circuit 110, or a voltage signal transmitted by an inductive element (e.g., inductor L1).

In some embodiments, the control circuit 2302 is coupled between the node N3 and the amplifier circuit 240, and includes an inverter INV3 and an inverter INV4, wherein the inverter INV3 is configured to receive the control signal Vcon2. Operations and connections of the inverters INV3 and INV4 are similar to those of the inverters INV1 and INV2 in the control circuit 2301, which will not be reiterated herein for simplicity.

In some embodiments, the amplifier circuit 240 is a feasible implementation of the amplifier circuit 140 in FIG. 1. The amplifier circuit 240 includes transistors T1-T3 serially connected to each other. In some embodiments, a control terminal of the transistor T1 is coupled to the control circuit 2301, and configured to receive the operating signal OS1, a first terminal of the transistor T1 is directly coupled or through an element having a large impedance (e.g., inductor L1) to the regulator circuit 110; and a second terminal of the transistor T1 is coupled to a first terminal of the transistor T2. A control terminal of the transistor T2 is coupled to the control circuit 2302, and configured to receive the operating signal OS2; a second terminal of the transistor T2 is coupled to a first terminal of the transistor T3. A control terminal of the transistor T3 is configured to receive the input voltage Vin, and a second terminal of the transistor T3 is coupled to the reference voltage terminal.

In other embodiments, when the amplifier device 100 shown in FIG. 1 does not include the voltage converting circuit 1202 and the control circuit 1302 (i.e., the second path as mentioned in FIG. 1), at least one transistor (e.g., the transistor T2 of the amplifier circuit 240 in FIG. 2) can be omitted in the amplifier circuit 140 accordingly. In other words, a number of transistors configured and included in the amplifier circuit 140 may be increased or decreased depending on a number of voltage converting circuits, the present disclosure can be provided without being limited to the embodiment as shown in FIG. 2.

In some embodiments, the voltage dividing circuit 250 is a feasible implementation of the voltage dividing circuit 150 in FIG. 1, the voltage dividing circuit 250 may include a resistor R4 and a resistor R5. As the embodiment shown in FIG. 2, the resistors R4 and R5 are configured to perform voltage division to the driving voltage VD1 to output the driving voltage VD2. In some embodiments, a first terminal of the resistor R4 is coupled to the node N1 and the voltage converting circuit 2201, a second terminal of the resistor R4 is coupled to a first terminal of the resistor R5 and the voltage converting circuit 2202. The first terminal of the resistor R5 is coupled to the second terminal of the resistor R4 and the voltage converting circuit 2202, a second terminal of the resistor R5 is coupled to the reference voltage terminal. In other embodiments, the voltage dividing circuit 250 may include a plurality of serial-connected resistors and/or a plurality of parallel-connected resistors, which is not limited in the present disclosure.

In some embodiments, the output unit 260 is a feasible implementation of the output unit 160 in FIG. 1. The output unit 260 includes an output matching circuit 261 and a capacitor C4, the capacitor C4 is coupled between the output matching circuit 261 and an output terminal of the amplifier circuit 240 (e.g., the first terminal of the transistor T1). In detail, the capacitor C4 is configured to block a direct signal of an output load from the amplifier device 200. The output matching circuit 261 is configured to perform impedance matching between the amplifier device 200 and the output load, the output matching circuit 261 may include one or more serial-connected and/or parallel-connected elements such as inductors, resistors, and capacitors, which is not limited in the present disclosure.

In some embodiments, an input unit 270 is a feasible implementation of the input unit 170 in FIG. 1. The input unit 270 includes an input matching circuit 271 and a bias circuit 272. In some embodiments, the input matching circuit 271 is configured to perform impedance matching between the amplifier device 200 and an input load, the input matching circuit 271 may include one or more serial-connected and/or parallel-connected elements such as inductors, resistors, and capacitors, which is not limited in the present disclosure. In some embodiments, the input matching circuit 271 is coupled to the amplifier circuit 240 (e.g., the control terminal of the transistor T3) through a capacitor C5, wherein the capacitor C5 is configured to block a direct signal of the input load from the amplifier device 200.

Moreover, as shown in FIG. 2, the bias circuit 272 and the capacitor C5 are coupled to an input terminal of the amplifier circuit 240, and the bias circuit 272 is configured to generate a fixed reference voltage, such that the fixed reference voltage and a signal transmitted through the capacitor C5 are superposed to be the input voltage Vin to be transmitted to the amplifier circuit 240. In some embodiments, the bias circuit 272 may include a transistor T4 and a current source IS. The current source IS is coupled to a first terminal and a control terminal of the transistor T4, and a second terminal of the transistor T4 is coupled to the reference voltage terminal. In some embodiments, the bias circuit 272 is coupled to the amplifier circuit 240 (e.g., the control terminal of the transistor T3) through a resistor R6, wherein the resistor R6 has a large resistance (e.g., 10 kΩ).

In some embodiments, the transistors T1-T4 are N-type metal oxide semiconductor (NMOS) transistors. In other embodiments, the transistors T1-T4 may be the same or different types of transistors (e.g., a bipolar transistor, a PMOS transistor, etc.), which is not limited in the present disclosure.

In view of the foregoing, the amplifier device 100 and amplifier device 200 are provided in present disclosure, and the voltage divider unit and the switch set included in the voltage converting circuit output different operating voltages to the amplifier circuit according to the driving voltage, so as to adjust the linearity of the amplifier circuit.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. An amplifier device, comprising:
   a regulator circuit configured to output a first driving voltage;
   a first voltage converting circuit coupled to the regulator circuit, configured to receive the first driving voltage, and select one of the first driving voltage and at least one first voltage related to the first driving voltage in order to output a first operating voltage;
   a first control circuit coupled to the first voltage converting circuit through a first node, and configured to receive the first operating voltage, and generate a first operating signal according to the first operating voltage and a first control signal; and
   an amplifier circuit coupled to the first control circuit and the regulator circuit, configured to receive the first driving voltage, and controlled by the first operating signal to generate an output voltage.

2. The amplifier device of claim 1, wherein the first voltage converting circuit comprises a first switch set, the first switch set is selectively switched to transmit one of the at least one first voltage and the first driving voltage.

3. The amplifier device of claim 2, wherein the first switch set comprises:
   a first switch having a first terminal coupled to the regulator circuit and a second terminal coupled to the first control circuit; and
   a second switch having a first terminal coupled to a reference voltage terminal and a second terminal coupled to the first node, wherein the first terminal of the second switch is coupled to the first terminal of the first switch through at least one resistor.

4. The amplifier device of claim 1, wherein the first voltage converting circuit comprises:
   at least one resistor coupled between the regulator circuit and a reference voltage terminal; and
   a plurality of switches parallelly connected to each other, wherein a plurality of terminals of the plurality of switches are coupled to the first node, and a plurality of another terminals of the plurality of switches are respectively coupled to a plurality of terminals of the at least one resistor.

5. The amplifier device of claim 1, wherein the first voltage converting circuit comprises:
   a first resistor coupled to the regulator circuit;
   a second resistor coupled to the first resistor through a second node, and coupled to a reference voltage terminal through a third node;
   a first switch coupled between the regulator circuit and the first node;
   a second switch coupled between the first node and the second node; and a third switch coupled between the first node and the third node.

6. The amplifier device of claim 1, wherein the first control circuit comprises:
a first inverter coupled to the first node, wherein an input terminal of the first inverter is configured to receive the first control signal; and
a second inverter coupled to the first node and serially coupled between the first inverter and the amplifier circuit.

7. The amplifier device of claim 1, wherein the amplifier circuit comprises:
a first transistor, wherein a first terminal of the first transistor is coupled to the regulator circuit, and a control terminal of the first transistor is configured to receive the first operating signal; and
a second transistor, wherein a control terminal of the second transistor is configured to receive an input voltage, and a first terminal of the second transistor is coupled to a second terminal of the first transistor.

8. The amplifier device of claim 1, further comprising:
an inductor coupled between the regulator circuit and the amplifier circuit.

9. The amplifier device of claim 1, further comprising:
a capacitor coupled between a reference voltage terminal and the first node.

10. The amplifier device of claim 1, further comprising:
a second voltage converting circuit coupled to the regulator circuit, and configured to receive a second driving voltage, and select one of the second driving voltage and at least one second voltage related to the second driving voltage in order to output a second operating voltage; and
a second control circuit coupled to the second voltage converting circuit, and configured to receive the second operating voltage, and generate a second operating signal according to the second operating voltage and a second control signal.

11. The amplifier device of claim 10, wherein the second voltage converting circuit comprises a second switch set, the second switch set is selectively switched to transmit one of the at least one second voltage and the second driving voltage.

12. The amplifier device of claim 10, further comprising:
a voltage dividing circuit coupled between the regulator circuit and the second voltage converting circuit, and configured to output the second driving voltage according to the first driving voltage.

13. The amplifier device of claim 10, wherein the amplifier circuit comprises:
a first transistor coupled to the regulator circuit, and controlled by the first operating voltage;
a second transistor serially coupled to the first transistor, and controlled by the second operating voltage; and
a third transistor serially coupled between the second transistor and a reference voltage terminal, and controlled by an input voltage.

14. An amplifier device, comprising:
an amplifier circuit coupled to a voltage input terminal, and configured to receive a first driving voltage;
a first voltage converting circuit comprising:
at least one first voltage divider unit coupled between the voltage input terminal and a reference voltage terminal, configured to receive the first driving voltage, and output at least one first voltage according to the first driving voltage;
a first switch coupled to the voltage input terminal, and configured to receive and transmit the first driving voltage to be a first operating voltage; and
a second switch coupled to the at least one first voltage divider unit, and configured to receive and transmit the at least one first voltage to be the first operating voltage; and
a first control circuit coupled between the amplifier circuit and the first voltage converting circuit, wherein the first control circuit is configured to receive the first operating voltage to generate a first operating signal,
wherein the amplifier circuit is configured to generate an output voltage according to the first operating signal.

15. The amplifier device of claim 14, wherein,
when the first switch is turned on, the first control circuit is configured to receive the first driving voltage and output the first operating voltage to be the first operating voltage; and
when the second switch is turned on, the first control circuit is configured to receive the at least one first voltage and output the at least one first voltage to be the first operating voltage.

16. The amplifier device of claim 14, wherein one of the at least one first voltage divider unit comprises a resistor or a plurality of resistors serially or parallelly connected with each other.

17. The amplifier device of claim 14, wherein the at least one first voltage divider unit is further configured to receive and output at least one second voltage according to the first driving voltage, and the first voltage converting circuit further comprises:
a third switch coupled to the at least one first voltage divider unit, and configured to receive and transmit the at least one second voltage to be the first operating voltage.

18. The amplifier device of claim 14, further comprising:
a second voltage converting circuit comprising:
at least one second voltage divider unit configured to receive a second driving voltage, and output at least one second voltage according to the second driving voltage;
a third switch coupled to the voltage input terminal, and configured to receive and transmit the second driving voltage to be a second operating voltage; and
a fourth switch coupled to the at least one second voltage divider unit, and configured to receive and transmit the at least one second voltage to be the second operating voltage; and
a second control circuit coupled between the amplifier circuit and the second voltage converting circuit, wherein the second control circuit is configured to receive the second operating voltage to generate a second operating signal,
wherein the amplifier circuit is configured to generate the output voltage according to the first operating signal and the second operating signal.

19. The amplifier device of claim 18, further comprising:
a voltage dividing circuit coupled between the voltage input terminal and the second voltage converting circuit, and configured to generate the second driving voltage according to the first driving voltage.

* * * * *